United States Patent [19]

Wirth

[11] 4,308,326

[45] Dec. 29, 1981

[54] HALFTONE CONTACT SCREEN AND PHOTOGRAPHIC METHOD OF MAKING THE SCREEN

[76] Inventor: John L. Wirth, 408 Greenwood Pl., Syracuse, N.Y. 13210

[21] Appl. No.: 24,592

[22] Filed: Mar. 28, 1979

[51] Int. Cl.$^3$ .......................... G03F 5/00; G03B 27/76
[52] U.S. Cl. .............................430/6; 430/7; 430/321; 430/396; 355/125; 358/283; 358/298
[58] Field of Search ....................... 430/6, 7, 321, 396; 355/125; 358/283, 233, 298

[56] References Cited

U.S. PATENT DOCUMENTS

| | | | |
|---|---|---|---|
| 3,565,527 | 2/1971 | Crespi | 430/6 X |
| 3,737,321 | 6/1973 | Torr et al. | 430/6 X |
| 3,916,096 | 10/1975 | Everett et al. | 358/283 |
| 4,066,353 | 1/1978 | Bobbe | 430/6 X |
| 4,083,632 | 4/1978 | Mailloux et al. | 430/6 X |
| 4,188,225 | 2/1980 | Liu | 430/7 |

OTHER PUBLICATIONS

Allebach et al., "Random Quasiperiodic Halftone Process", J. Opt. Soc. Am., vol. 66, No. 9, 9/76, pp. 909-917.
Allebach et al., "Analysis of Halftone Dot Profile and Aliasing in the Discrete Binary Representation of Images", J. Opt. Soc. Am., vol. 67, 9/77, p. 1147.
Kinderman et al., ACM Transactions on Math. Software, vol. 3, No. 3, 9/77, p. 257.
Knuth, The Art of Computer Programming, vol. 2, 1969.
Lehmer, The Annals of Computation Lab. of Harvard Univ., vol. XXVI, 1951, p. 141.
Marsaglia, Annals of Mathematical Statistics, vol. 32, No. 8, Sep. 1961, p. 894.
Naylor et al., Computer Simulation Techniques, Wiley & Sons, 1966.
Perkin-Elmer Corp., Service Bureau Microdensitometer Image Digitization, Pamph.
Roetling, Photographic Science & Engineering, vol. 21, No. 2, Mar./Apr. 1977, pp. 60-65.
Von Neumann, National Tech. Information Service Document No. PB-184887, pp. 36-78.
Wesner, Applied Optics, vol. 13, No. 7, Jul. 1974, pp. 1703-1710.
Wirth, Journal of Applied Photographic Engineering, vol. 4, No. 2, Spring 1978, pp. 91-92.
Klensch, RCA Review, Sep. 1970, pp. 517-533.
Berry et al., "The Theory of Photographic Process", Chapter 2, 1966.
Dashiell et al., Applied Optics, vol. 16, No. 4, Apr. 1977, pp. 1009-1037.
Dashiell et al., Applied Optics, vol. 16, No. 7, Jul. 1977, pp. 1936-1943.
Dorn et al., "Mathematics & Computing, with Fortran Programming", 1967.
E. I. DuPont, Photomechanical Requirements for Dycril Platemaking, 1973.
IBM, Random Number Generation and Testing, Publ. GC20-8011-0, 1969.
Juncosa, Ballistic Research Lab. Rpt., Aberdeen Proving Ground, 1953.

Primary Examiner—Charles L. Bowers, Jr.

[57] ABSTRACT

A computer-generated halftone contact screen is disclosed which consists of a rectangular array of small abutting square areas each of uniform transmittance (density), in which the transmittance (density) of the squares is described by a random variable whose distribution is controlled to give the screen a desired reproduction curve. The facsimile produced using the screen, its equivalent produced by computer-assisted means, and its representation in computer memory are disclosed.

3 Claims, 2 Drawing Figures

HALFTONE CONTACT SCREEN AND PHOTOGRAPHIC METHOD OF MAKING THE SCREEN

THE NATURE OF HALFTONE REPRODUCTION IN PRINTING

Reproduction methods employing a printing press are not capable of reproducing areas as small as the grains of a photographic image. The duPont reference, p. 2, gives as the minimum thickness of a line printable with a Dycril printing plate as 0.003" (76$\mu$) and the minimum diameter of an isolated dot as 0.008" (203$\mu$), for instance. The size of photographic grains, on the other hand, range from a diameter on the order of 0.05$\mu$ for high resolution films, to 1.1$\mu$ for high-speed roll film, to a maximum of 2.5$\mu$ for the grainiest films (Berry, pp. 36, 39). I.e., the smallest printable dots have diameters on the order of a few tens times that of the largest grains. If a printing plate is produced from a continuous-tone photograph, the resulting period image is a severe distortion of the photographic image. The printed image contains none of the gray tones of the photographic image and consists only of large, solid black or solid white areas.

The printing plate must therefore be made from a facsimile of the continuous-tone image which, in the positive facsimile, consists of solid black areas, on a white ground, large enough to be faithfully reproduced in printing. Such a facsimile is called a "halftone facsimile." The average densities of small areas of the facsimile can be made to vary directly with the densities of the corresponding areas of the continuous-tone image. If the facsimile is then viewed from a distance at which the individual solid black areas are not perceived by the eye, it appears to contain grey tones, or "halftones," similar to those of the continuous-tone image.

CONTACT SCREENS

Many methods have heretofore been employed to produce halftone facsimiles. At the present time, nearly all facsimiles are produced using a contact screen.

A contact screen consists of a photographic film or like material whose transmittance varies in a pattern, the pattern usually consisting of a rectangular array of contiguous square areas each of varying transmittance. (In this disclosure, a "rectangular array of areas" is understood to be an array of areas the centers of which are the points of a rectangular array of points; a "rectangular array of points" is understood to be the points of intersection of a series of equidistant parallel lines with a perpendicular series of equidistant parallel lines separated by the same distance; and the "interval" of a rectangular array of points is understood to be the smallest distance between points of the array). The transmittance of each area decreases continuously from its center to its edges.

The halftone facsimile is commonly produced using a contact screen by the following means:

With the contact screen held in front of and in immediate contact with the lithographic film in the process camera, the continuous-tone photograph (positive print) to be reproduced—the "copy"—is photographed. The developed lithographic film then constitutes the desired (negative) facsimile.

The principle of operation of the commonly-used contact screen is as follows:

The illumination of the projected image over each of the square areas, which is small, is substantially constant. At a square area, the illumination immediately behind the screen is therefore substantially the product of a constant and the transmittance of the square area, and so is greatest at the center and decreases toward the edges. The size of the region where the illumination exceeds a certain fixed illumination therefore depends on the illumination of the image over the square area, the greater the illumination the larger the region.

The ideal lithographic film would be one of such high contrast that, for a given exposure time, the film could be considered to be exposed to saturation by illuminations exceeding a certain illumination and to be wholly unexposed by lesser illuminations. Actual lithographic film, in its combined operation with the printing means, produces the same effect that such ideal film would: ink is not deposited or deposited in parts of the printed image according to whether the illumination at the film exceeds a certain illumination or not. Therefore, in describing the combined operation of lithographic film and a printing means, no inaccuracy is introduced by considering all lithographic film to be such ideal film.

A region of the film behind a square area can thus be considered to be exposed to saturation, and the remainder to be unexposed. In the trade, the exposed region is called a "dot." The facsimile therefore consists of an array of dots, the dots being larger where the illumination of the projected image is greater. In a positive facsimile—one whose dots are white against a black ground—a greater fraction of the area of the facsimile is white where the reflectance of the copy is greater, and these areas appear lighter in tone to the eye; the tones of the original image thus being reproduced.

BRIEF SUMMARY OF THE INVENTION

The invention consists of a computer-generated contact halftone screen whose transmittance (and density) is described by a random variable whose distribution is controlled to give the screen the desired reproduction curve.

The halftone facsimile which is produced by use of the screen, or produced by computer-assisted means, and its representation in computer memory are disclosed.

The screen consists of a rectangular array of small abutting square areas each of uniform transmittance (density). That the transmittance (density) of the screen is described by a random variable is to say that knowledge of the transmittance (density) of any one of the square areas constitutes a minimum of information as to the transmittance (density) of any other of the square areas and the probability that the transmittance (density) at an arbitrary square area is less than or equal to the value x is an increasing function of x (a second function, if density); which function is called the "distribution" of the transmittance (density), sometimes also called the "distribution function" or the "cumulative distribution function."

THE PRIOR ART

Computer-Generated Contact Screens

Special-purpose computer-generated contact halftone screens, of the type described above in "Contact Screens," are known. See, e.g., p. 1021 of the first Daniell reference and pp. 1941-1942 of the second, describing screens written by an Optronics plotting microdensitometer. Computer generation provides the means of producing halftone contact screens it would be impossible to produce by any other means.

RANDOM CONTACT SCREENS

The Wesner reference, p. 1709, describes "random grain" non-contact halftone screens, which consist of "grains" of high density, of uniform or random shape, whose positions on a transparent surface are random. Compare, also, Roetling, p. 62 ("dither" screens). An example of a random contact screen is the contact screen which can be produced using such a random grain non-contact screen. This is the contact screen which, in contact with the lithographic film, can be used to produce the same facsimile as that produced using the non-contact screen at some distance from the film. To produce this screen, a uniformly white object is photographed on positive continuous-tone film with the process camera, with the non-contact screen at its usual position in the camera. The processed positive continuous-tone film is the random contact screen.

The screen so produced has a density which varies continuously and produces a positive facsimile consisting of black spots of varying size, on a white ground, whose positions are random. However, the character and effect of a "random" contact screen, as defined above, may be quite otherwise, as shown by the presently disclosed screens. The density of these screens is constant in some places and discontinuous elsewhere, and they produce positive facsimiles consisting of square black spots of equal size, on a white ground, which occupy a subset of the square areas of a rectangular array of abutting square areas.

DESCRIPTION OF FIG. 1

FIG. 1 is a plan view of the invention, a computer-generated halftone contact screen, not drawn to scale. The screen is a photographic transparency consisting of a rectangular array of small contiguous square areas, $1$, $2$, ..., $12$, and a great many others, each of uniform density. The density of a typical square area is described by a random variable. The different densities of the square areas are suggested by the different hatchings. Surrounding the square areas is a margin $13$ of arbitrary density whose purpose is to allow the screen to be handled without fingerprints getting on the square areas.

The square areas are typically a fraction of a millimeter square, so that the width of the margin, typically a few centimeters, rather than having the width relative to the width of a square area which is indicated by the figure, is several hundred times the width of a square area. Only the extreme corner of the screen, which typically contains on the order of a few million square areas, is shown.

DESCRIPTION OF FIG. 2

BRIEF STATEMENT OF THE PRINCIPLE OF THE DISCLOSED SCREEN

The disclosed screen is used in the process camera in the same way as the contact screens heretofore known. The illumination of the projected image can be assumed to be substantially constant in a small region including a number of square areas of the screen. If the product of the illumination and the transmittance of a square area is equal to or exceeds the certain illumination which can be considered just necessary to expose the lithographic film, a white spot is produced in the positive facsimile, and otherwise a black spot. If the probability that the product is equal to or greater than the certain illumination is a certain function of the illumination, the fraction of the number of white spots in the region is the certain function of the illumination. And so the integrated reflectance of the printed positive facsimile—the average reflectance of the region of the facsimile corresponding to the small region of the projected image—is given a certain relation to the copy reflectance.

The present specification discloses the screen for which the probability stated in such as to result in an arbitrary desired relation between integrated facsimile reflectance and copy reflectance.

DIFFERENCE IN PRINCIPLE OF OPERATION

It is seen that the principle of operation of the disclosed screen differs sharply from that of the halftone contact screens heretofore known. The latter principle is that the different reflectances of the different parts of the copy produce in the facsimile *dots of different size*, whereas the former principle is that the different reflectances produce *different incidences of equisized dots* (herein called "spots" to distinguish them from variably-sized "dots").

DEFINITIONS

In this disclosure, unless otherwise stated, the facsimile is assumed to be produced by the method most commonly employed: the photographing, with a process camera, of the copy, a positive photographic print, on lithographic film; with the contact screen held in immediate contact with, and immediately in front of, the lithographic film, such as to intercept the light falling on the film.

"Maximum copy luminance" is understood in this disclosure to be the luminance of a perfectly diffusely reflecting plane white object when placed, under the conditions of illumination obtaining, at the plane of the copy.

The "copy luminance" at a point of the copy is the luminance of the light reflected by the copy at that point divided by the maximum copy luminance. This is the fraction of the incident light which is reflected by the copy at the point.

The "copy density" at a point of the copy is $-\log$ (copy luminance).

The "maximum image illumination" is the illumination at the plane of the screen which results when, under the condition of illumination obtaining, the copy is replaced with a perfectly diffusely reflecting white object.

The "image illumination" at a point of the copy image at the plane of the contact screen is the illumination at the point due to the image divided by the maximum image illumination.

The "image density" at a point of the copy image at the plane of the screen is $-\log$ (image illumination).

The "output illumination" at a point immediately behind the contact screen, at the film, is the illumination at the point of the light of the copy image which has passed through the screen divided by the maximum image illumination.

The "output density" is $-\log$ (output illumination).

The "exposure illumination" is the illumination of the film which, as described above in "Contact Screens,"

can be considered, for a fixed exposure time, to be just sufficient to expose the lithographic film.

The "critical illumination" is the exposure illumination divided by the maximum image illumination.

The "critical density" is $-\log$ (critical illumination).

Let the exposure illumination be $L_E$ and the maximum image illumination $L_M$, so that the critical illumination is $L_E/L_M$ and the critical density is $-\log (L_E/L_M) = -(\log L_E - \log L_M) = -\log L_E + \log L_M$. If the copy illumination is changed by the factor A, where A is a positive number which may be greater or less than 1, so that the maximum image illumination is $AL_M$, the critical illumination is changed by the factor $1/A$. And the critical density becomes $-\log (L_E/AL_M) = -(\log L_E - \log A - \log L_M) = -\log L_E + \log A + \log L_M$, so that the critical density is changed by log A units of density. And if the exposure time is changed by the factor A, so that (assuming reciprocity) the exposure illumination becomes $I_E/A$, the critical illumination is also changed by the factor $1/A$. And the critical density also becomes $-\log (L_E/AL_M)$ and is changed by log A units of density. A change in the exposure by a factor A thus alters the critical illumination by the factor $1/A$ and the critical density by log A units of density.

PROBABILITY OF THE OCCURRENCE OF A WHITE SPOT IN TERMS OF THE SCREEN

Density Distribution

Let $P(x)$ be the distribution, or "cumulative distribution function," of the density of the screen, i.e., the function equal, for an argument x, to the probability that the density at a typical point, or, what is the same thing, the density of a typical square area, is less than or equal to x.

Let $P_d(x)$ be the distribution of the output density where the image density is d.

Where the image density is d and the density of the screen is x, the output density is $x+d$. So that $P(x) = P_d(x+d)$, i.e., the probability that the density of the screen is less than or equal to x is equal to the probability that the output density is less than or equal to $x+d$ where the image density is d. Writing $x' = x+d$, then $x = x' - d$ and $P_d(x') = P(x'-d)$. Now denoting the variable $x'$ by x, this may be written $P_d(x) = P(x-d)$.

Denote the function equal to $P(x)$ at the argument $-x$ as $P^-(x)$ and call it the "reflection of $P(x)$." Then $P_d(x) = P^-(d-x)$. For fixed x, the output density where the image density is d, is, as a function of d, a translation of $P^-(d)$, viz., $P^-(d-x)$.

Denote the critical density by C. The film is exposed if the output density is less than or equal to C. $P_d(C) = P^-(d-C)$, i.e., the probability that the output density is less than or equal to C where the image density is d—the probability that the film is exposed where the image density is d, the probability of the occurrence of a white rather than black spot in the positive facsimile—is the translation of $P^-(d)$, $P^-(d-C)$.

THE SCREEN DENSITY DISTRIBUTION IN TERMS OF THE DESIRED REPRODUCTION CURVE

Consider what the average reflectance is of a small region of the positive facsimile corresponding to a small region where the image density is d. Under the assumption that the black spots are perfectly black (that their reflectance is 0) and the white spots perfectly white (that their reflectance is 1), that is the fraction of the region consisting of white spots rather than black spots, which is $P_d(C)$. The density corresponding to the average reflectance is $-\log P_d(C) = -\log P^-(d-C)$.

Let $R(d)$ denote the reproduction curve of the screen—the graph of the integrated density of the positive facsimile against the copy density (which, disregarding flare, is equal to the image density); then $R(d) = -\log P^-(d-C)$. Taking antilogs of both sides of this equation, antilog $[-R(d)] = P^-(d-C)$. Antilog X is exp (1 n 10 X), where exp is the exponential function and 1 n is the natural logarithm, so that antilog $[-R(d)]$ is 1/antilog $R(d)$.

Therefore, under the above-stated assumption as to the reflectances of the black and white spots, in order to obtain a screen with a desired reproduction curve, it would be sufficient to choose as the distribution of the density the function P the translation $P^-(d-C)$ of the reflection of which is equal to the reciprocal of the antilog of the curve.

In fact, of course, the reflectance of the paper inked with black ink (denote it $R_B$) is a number less than 1 and the reflectance of the uninked white paper (denote it $R_W$) is a number greater than 0, $R_B < R_W$. What the reproduction curve is in fact, then, is calculated. The average reflectance of the small region of the positive facsimile where the copy density is d is $P_d(C)R_W + [1 - P_d(C)]R_B$, i.e., the average reflectance is the fraction of the area of the region consisting of white spots times the reflectance there, plus the fraction of the region consisting of black spots times the reflectance there. This is equal to $R_B + P_d(C)(R_W - R_B)$. The density corresponding to this reflectance is $-\log [R_B + P_d(C)(R_W - R_B)]$, or $-\log [R_B + P^-(d-C)(R_W - R_B)]$, the reproduction curve.

Now writing $R(d)$ for the actual reproduction curve, $R(d) = -\log[R_B + P^{-(d-C)}(R_W - R_B)]$, and similarly as above, 1/antilog $R(d) = R_B + P^-(d-C)(R_W - R_B)$, or $P^-(d-C) = ([1/\text{antilog } R(d)] - R_B)/(R_W - R_B)$. The function P the translation $P^-(d-C)$ of whose reflection is equal to the quantity on the right-hand side of this equation—a linear function of the reciprocal of the antilog of $R(d)$—is, then, the distribution of the screen with the reproduction curve $R(d)$.

Setting $d' = d+C$ and writing d for $d'$, $P^-(d)$ is $([1/\text{antilog } R(d+C)] - R_B)/(R_W - R_B)$, and $P(d)$ is $([1/\text{antilog } R(C-d)] - R_B)/(R_W - R_B)$. This is $[(1/\exp[\ln 10 \, R(C-d)] - R_B]/(R_W - R_B)$, so that $$P(d) = \frac{\exp[-\ln 10 \, R(C-d)] - R_B}{R_W - R_B} \qquad (1)$$

THE DENSITY DISTRIBUTION DERIVED FROM THE APPROPRIATE LINEAR REPRODUCTION CURVE

As above, let $R_B$ be the reflectance of the paper inked with the black ink and $R_W$ the reflectance of the uninked white paper. Call the difference between the density of the inked paper $(-\log R_B)$ and that of the uninked paper $(-\log R_W)$ the "paper-ink density range."

It is usually not possible to make the tones of a halftone facsimile identical to the tones of the copy, i.e., to make the density of the facsimile equal to the density of the corresponding part of the copy. The paper-ink density range is usually less than the density range of the copy: the density of the white printing paper is usually greater than the density of the lightest parts of the photographic print constituting the copy, and the density of the inked paper is usually less than that of the darkest parts of the print. If the two density ranges happen to be equal, the densities of the paper and the lightest parts of the copy, and the densities of the inked paper and the darkest parts of the copy, are seldom identical.

It is, then, desired in most cases to make the relation between the tones of the facsimile and the tones of the copy a linear function if not the identity function: to make the reproduction curve a straight line not necessarily the straight line with slope 1 passing through the origin.

Below, the screen density distribution such tht the reproduction curve is the appropriate straight line is derived.

Denoted by G the slope of the reproduction curve.

Denote by D the d-intercept of the reproduction curve, where d is copy density.

Then the equation of the reproduction curve is $G(d-D)$.

In (1), the function $R(d)$ is $G(d-D)$ and, setting $d=C-d'$ and writing d for d', $R(C-d)=G[(C-d)-D]$. Substituting this value for $R(C-d)$ in (1), $$P(d) = \frac{\exp[-\ln 10 \ G(C - d - D)] - R_B}{R_W - R_B}$$

$$P(d) = \frac{\exp[\ln 10 \ G(d - C + D)] - R_B}{R_W - R_B} \quad (2)$$

The right-hand side of (2) is thus the required density distribution of the screen in terms of the slope of the reproduction curve G, the critical density C, the d-intercept of the reproduction curve D, the reflectance of the inked paper $R_B$ and the reflectance of the white paper $R_W$.

The values of G and D are determined below in terms of $C_N$, $C_X$, $F_N$ and $F_X$, where these denote, respectively, the minimum and maximum densities of the copy and of the facsimile. $F_N$ is equal to $-\log [R_B+P_2(R_W-R_B)]$, where $P_2$, $0<P_2\leq 1$, is $P_{C_N}(C)$, the probability that the output density is less than or equal to C where the copy density is $C_N$, i.e., the probability of the occurrence of a white spot in the facsimile where the tone of the copy is lightest. Likewise, $F_X$ is equal to $-\log [R_B+P_1 (R_W-R_B)]$, where $p_1$, $0\leq p_1<p_2$ is $P_{C_X}(C)$, the probability that the output density is less than or equal to C where the copy density is $C_X$, i.e., the probability of the occurrence of a white spot where the tone of the copy is darkest.

G and D in Terms of $C_N$, $C_X$, $F_N$ and $F_X$

With $d=C_N$, the reproduction curve is $$F_N=G(C_N-D)$$

Solving for D, $$(F_N/G)=C_N-D$$

$$D=C_N-(F_N/G) \quad (3)$$

With $d=C_X$, the reproduction curve is $$F_X=G(C_X-D)$$

Solving for D similarly as above, $$D=C_X-(F_X/G) \quad (4)$$

Equating these two expressions for D to determine G in terms of $C_N$, $C_X$, $F_N$, and $F_X$, $$C_N - \frac{F_N}{G} = C_X - \frac{F_X}{G}$$

$$GC_N - F_N = GC_X - F_X$$

$$F_X - F_N = GC_X - GC_N$$

$$= G(C_X - C_N)$$

$$G = \frac{F_X - F_N}{C_X - C_N} \quad (5)$$

$F_X-F_N$ is the density range of the facsimile, and $C_X-C_N$ is the density range of the copy; and thus G is the ratio of these densities.

In this disclosure, this ratio is called the "density ratio."

To determine D in terms of $C_N$, $C_X$, $F_N$ and $F_X$, the expression for G in (5) may be substituted in (3):

$$D = C_N - \frac{F_N}{\frac{F_X - F_N}{C_X - C_N}}$$

$$= C_N - \frac{F_N(C_X - C_N)}{F_X - F_N}$$

$$= \frac{C_N F_X - C_N F_N - F_N C_X + F_N C_N}{F_X - F_N}$$

$$D = \frac{C_N F_X - F_N C_X}{F_X - F_N} \quad (6)$$

Denote by $S_N$ and $S_X$ the minimum and maximum densities of the required screen, respectively. Relations involving $S_N$, $S_X$ and the screen density range, $S_X-S_N$, are determined below.

$S_N$ and $S_X$ and the Screen Density Range $S_N$ is the argument for which the screen distribution is equal to 0. In (2), setting $d=S_N$ and setting the distribution equal to 0, $$\frac{\exp[\ln 10 \ G(S_N - C + D)] - R_B}{R_W - R_B} = 0$$

$$\exp[\ln 10 \ G(S_N - C + D)] = R_B$$

Taking the log of both sides, $$G(S_N-C+D)=\log R_B$$

$$S_N-C+D=\log R_B/G$$

$$S_N=(\log R_B/G)+C-D \quad (7)$$

Likewise, $S_X$ is the argument for which the distribution is equal to 1. Setting $d=S_X$ and the distribution equal to 1 in (2), $$\frac{\exp[\ln 10 \ G(S_X - C + D)] - R_B}{R_W - R_B} = 1$$

$$\exp[\ln 10 \ G(S_X - C + D)] - R_B = R_W - R_B$$

-continued
$$\exp[\ln 10\, G(S_X - C + D)] = R_W$$

Solving for $S_X$ similarly as above, $$S_X = (\log R_W/G) + C - D \qquad (8)$$

The screen density range, $S_X - S_N$, is $$(\log R_W/G) + C - D - [(\log R_B/G) + C - D]$$

$$= (\log R_W/G) - (\log R_B/G)$$

$$= 1/G[-\log R_B - (-\log R_W)] = 1/G(D_B - D_W)$$

That is, the screen density range is equal to the reciprocal of G times the paper-ink density range.

If $p_1 = 0$ and $p_2 = 1$, $F_X = D_B$ and $F_N = D_W$, and this is then the reciprocal of G times the density range of the facsimile, $F_X - F_N$.

Also if $p_1 = 0$ and $p_2 = 1$, from (7), $$S_N = (-F_X/G) + C - D$$

Substituting in this equation the expression for D in (4), $$S_N = (-F_X/G) + C - [C_X - (F_X/G)]$$

$$S_N = C - C_X \qquad (9)$$

And, under the same assumption as to $p_1$ and $p_2$, from (8), $$S_X = (-F_N/G) + C - D$$

And substituting the expression for D in (3), $$= (-F_N/G) + C - [C_N - (F_N/G)]$$

$$S_X = C - C_N \qquad (10)$$

SUMMARY OF RELATIONS

Given the reflectances of the black ink and white paper, $R_B$ and $R_W$; the required minimum and maximum densities of the facsimile, $F_N = -\log[R_B + p_2(R_W - R_B)]$ and $F_X = -\log[R_B + p_1(R_W - R_B)]$; the minimum and maximum densities of the copy, $C_N$ and $C_X$; and the critical density D; the required screen density distribution is $$P(d) = \frac{\exp[\ln 10\, G(d - C + D)] - R_B}{R_W - R_B}$$

where $G = (F_X - F_N)/(C_X - C_N)$ is the slope of the reproduction curve and $D = (C_N F_X - F_N C_X)/(F_X - F_N)$ is its d-intercept.

The minimum density of the screen $S_N$ is $[(\log R_B)/G] + C - D$, the maximum density is $[(\log R_W)/G] + C - D$, and the screen density range is $(1/G)(D_B - D_W)$.

If $p_1 = 0$ and $p_2 = 1$, $S_N$ is $C - C_X$, $S_X$ is $C - C_N$ and the screen density range is $(1/G)(F_X - F_N)$.

USE OF PREPRODUCED SCREENS UNDER ALTERED CONDITIONS

Suppose a screen has been produced suitable for reproducing a first piece of copy, where the minimum and maximum densities of the copy were $C_N$ and $C_X$, respectively; the minimum and maximum densities of the facsimile were $F_N$ and $F_X$; the densities of the inked and uninked paper were $R_B$ and $R_W$; and the critical density was C.

Suppose that now a second piece of copy is to be reproduced, where the minimum and maximum densities of the copy are $C'_N$ and $C'_X$, respectively; the minimum and maximum densities of the facsimile are to be $F'_N$ and $F'_X$; the densities of the inked and uninked paper are $R'_B$ and $R'_W$; and the critical density is to be $C'$.

($F'_N$ and $F'_X$ are $-\log[R'_B + p'_2(R'_W - R'_B)]$ and $-\log[R'_B + p'_1(R'_W - R'_B)]$, respectively, where $p'_2 = p'_D(C'_N)$ and $p'_1 = p'_D(C'_X)$.)

Then the screen already produced suitable for reproducing the first piece of copy under the original conditions is also suitable for reproducing the second piece of copy under the altered conditions if the screen density distribution required by the altered conditions is the same as that required by the original conditions, i.e., if, from (2).

$$\frac{\exp[\ln 10\, G'(d - C' + D')] - R'_B}{R'_W - R'_B} = \frac{\exp[\ln 10\, G(d - C + D)] - R_B}{R_W - R_B}$$

This equation is $$\frac{\exp[\ln 10\, G'(d + m)] + n}{o} = \frac{\exp[\ln 10\, G(d + p)] + q}{r}$$

where
$m = -C' + D'$
$n = -R'_B$
$o = R'_W - R'_B$
$p = -C + D$
$q = -R_B$
$r = R_W - R_B$ Collecting the exponential functions on one side of the equation, $$r \exp[\ln 10\, G'(d+m)] + rn = o \exp[\ln 10\, G(d+p)] + oq$$

$$r \exp[\ln 10\, G'(d+m)] - o \exp[\ln 10\, G(d+p)] = oq - rn \qquad (11)$$

(11) implies that $$r \exp[\ln 10\, G'(d+m)] = o \exp[\ln 10\, G(d+p)] \qquad (12)$$

and $$oq = rn \qquad (13)$$

To prove the later statement, it is sufficient to prove that, for constants H, I, J, K and L and real variable d, if $\exp(Hd + I) - \exp(Jd + K) = L$, then $L = 0$ and $H = J$ and $I = K$ for at least one positive or negative value of d; since if this result holds for one value of d, i.e., the functions $\exp(Hd + I)$ and $\exp(Jd + K)$ are identical functions, they are identical for any other value of d; and since (11) is $\exp(\ln r) \exp[\ln 10\, G'(d+m)] - \exp(\ln o) \exp[\ln 10\, G'(d+p)] = oq - rn$, or $\exp[\ln 10\, G'(d+m) + \ln r] - \exp[\ln 10\, G(d+p) + \ln o] = oq - rn$, and H, I, J, K and L may be taken as $\ln 10\, G'$, $(\ln 10)G'm + \ln r$, $\ln 10\, G$, $(\ln 10)Gp + \ln o$ and $oq - rn$, respectively.

Suppose $L=L_1>0$. For $\delta>0$, take d such that exp $(Hd+I)=\delta$, i.e., $Hd+I=\ln \delta$, $Hd=\ln \delta-I$. Then $\delta-\exp(Jd+K)=L$, $-\exp(Jd+K)=L-\delta$, exp $(Jd+K)=\delta-L$. So that $(\delta-L)$ must be positive and the relation $L<\delta$ must hold. But $\delta$ may be chosen arbitrarily small and for $\delta$ chosen small enough $L>\delta$ for d with $Hd\leq\ln \delta-I$. Suppose $L=L_2>0$. For $\delta'>0$, take d such that exp $(Jd+K)=\delta'$, i.e., $Jd+K=\ln \delta'$, $Jd=\ln \delta'-K$. Then exp $(Hd+I)-\delta'=L$, exp $(Hd+I)=L-\delta'$. $(L-\delta')$ must be positive and the relation $-L<\delta'$ must hold. But for $\delta'$ chosen sufficiently small $-L>\delta'$ for $Jd\leq\ln \delta'-K$. Hence, for d such that the conditions $Hd\leq\ln \delta-I$ and $Jd\leq\ln \delta'-K$ hold simultaneously, it cannot be true that $L=L_1$ or $L=L_2$, and so $L=0$. (These conditions hold simultaneously for d sufficiently small or large since H and J must have the same sign; otherwise the equation exp $(Hd+I)-\exp(Jd+K)=L$ clearly could not hold; the absolute value of the left hand side would exceed the absolute value of L for d small or large enough.)

That exp $(Hd+I)=\exp(Jd+K)$ for a range of values of d implies $H=J$ and $I=K$ for these values, since multiplying that equation by exp $(-Hd-I)$ gives exp $(Hd+I)\exp(-Hd-I)=\exp(Jd+K)\exp(-Hd-I)$, or exp $(Hd-I-Hd-I)=\exp(Jd-Hd+K-I)$, or exp $(O)=\exp[(J-H)d+K-I]$, so that $(J-H)d+K-I=0$ and d, instead of being a variable, would be the constant $-(K-I)/(J-H)$ unless $J=H$, and consequently $K=I$ as well.

I. Use of preproduced screens where the density ratio and paper-ink density range are the same A. Where the minimum and maximum facsimile densities and the minimum and maximum copy densities are each changed by the same factor Suppose that the minimum and maximum facsimile densities are now each required to be N times the respective facsimile densities assumed in producing the screen, where N is a positive number less than or greater than 1; $F_N'=NF_N$, $F_X'=NF_X$; that the minimum and maximum copy densities are each N times the respective densities of the first piece of copy; $C_N'=NC_N$, $C_X'=NC_X$; and that the reflectances of the inked and uninked paper are the same: $R_B'=R_B$, $R_W'=R_W$.

Then, because of the latter assumption, (13) holds, with $oq=-(R_W'-R_B')-R_B=(R_W-R_B)--R_B'=rn$.

And, in (12), $r=o$: $r=R_W-R_B=R_W'-R_B'=o$; also in (12), $G'=G$: $G'=(F_X'-F_N')/(C_X'-C_N')=(NF_X-NF_N)/(NC_X-NC_N)=(F_X-F_N)/(C_X-C_N)=G$.

So that if $m=p$, (12) holds. This requires $$m=-C'+D'=-C+D=p \quad (14)$$

D' is, from (3) (equation (4) could just as well be used in this calculation), $C_N'-(F_N'/G')=NC_N-(NF_N/G)=N[C_N-(F_N/G)]=ND$.

Substituting this value for D' in (14) and solving for C'.

$$-C'+ND=-C+D$$
$$-C'=-C+D-ND$$
$$=-C+D(1-N)$$
$$C'=C-D(1-N)$$

So that if the critical density is changed by $-D(1-N)$, or $D(N-1)$, units of density, the screen suitable for reproducing the first piece of copy can also be used to reproduce the second piece of copy.

As described above under "Definitions," the critical density is changed by $D(N-1)$ units of density by changing the exposure (changing the copy illumination or the exposure time) by the factor antilog $D(N-1)=\exp[\ln 10 \, D(N-1)]$.

B. Where the facsimile density range is the same but the facsimile density minimum and maximum ae changed.

Suppose the facsimile density range is now to be the same but that $F_N'=F_N+Y$ and $F_X'=F_X+Y$, where Y is a positive or negative number, i.e., the minimum and maximum facsimile densities are to be changed each by the same amount. Suppose $C_N'=C_N$ and $C_X'=C_X$. And suppose $R_B'=R_B$ and $R_W'=R_W$.

As above in I.A., because of the latter assumption, (13) holds and in (12) $r=o$.

Also in (12), $G'=G$: $G'=(F_X'-F_N')/(C_X'-C_N')=[(F_X+Y)-(F_N+Y)]/(C_X-C_N)=(F_X-F_N)/(C_X-C_N)=G$.

So that, as above, if (14) holds, (12) holds. Here $$D'=C_N'-(F_N'/G')=C_N-(F_N+Y)/G$$
$$=C_N-(F_N/G)-(Y/G)=D-(Y/G)$$

Substituting this value for D' in (14) and solving for C, $$-C'+D-(Y/G)=-C+D$$
$$C'=C-(Y/G)$$

So that the same screen is suitable for producing the second facsimile if the critical density is changed by $-Y/G$ units of density.

C. Where the copy density range is the same but the copy density minimum and maximum are changed.

Suppose the density range of the second piece of copy is the same as that of the first but that $C_N'=C_N+Q$ and $C_X'=C_X+Q$, where Q is a positive or negative number. And suppose $F_N'=F_N$ and $F_X'=F_X$; and $R_B'=R_B$ and $R_W'=R_W$.

As above in I.A. and I.B., (13) holds and $r=o$ in (12). And in (12), $G'=G$: $G'=(F_X'-F_N')/(C_X'-C_N')=(F_X-F_N)/[(C_X+Q)-(C_N+Q)]=(F_X-F_N)/(C_X-C_N)=G$.

So that, again, if (14) holds, (13) holds.

Here D' is, from (3), $C_N'-(F_N'/G')=(C_N+Q)-(F_N/G)=C_N-(F_N/G)+Q=D+Q$. Substituting this value in (14) and solving for C', $$-C'+(D+Q)=-C+D$$
$$-C'=-C-Q$$
$$C'=C+Q$$

So that if the critical density is changed by Q units of density, the screen can be used with the second piece of copy.

D. Where the paper-ink density range is the same but the densities of the inked and uninked paper are changed.

Suppose that $D_B' = D_B + Z$ and $D_W' = D_W + Z$, i.e., that the densities of the inked paper and uninked paper now each differ by Z units of density from the values assumed in the production of the screen. This is $R_B' = $ antilog $(-D_B') = $ antilog $[-(D_B+Z)] = $ antilog $(-D_B)$ antilog $(-Z) = R_B$ antilog $(-Z)$, and similarly $R_W' = R_W$ antilog $(-Z)$, i.e., $R_B'$ and $R_W'$ each differ from $R_B$ and $R_W$ by the factor antilog $(-Z)$. And suppose $F_N' = F_N$ and $F_X' = F_X$; and $C_N' = C_N$ and $C_X' = C_X$.

In (13), $$oq = (R_W' - R_B') \cdot -R_B' =$$

$$[\text{antilog}(-Z) R_W - \text{antilog}(-Z) R_B] \cdot -R_B$$

$$= (R_W - R_B)[-\text{antilog}(-Z) R_B] = (R_W - R_B) \cdot -R_B' = rn$$

In (12), $G' = G$. And $o = R_W' - R_B' = $ antilog $(-Z)(R_W - R_B) = $ antilog $(-Z)$ r. The right-hand side of (12) is therefore $$r \exp(-Z \ln 10) \exp[\ln 10 \, G(d + p)] =$$

$$r \exp(\ln 10 \, [G(d + p) - Z])$$

$$= r \exp(\ln 10 \, G[d + p - (Z/G)])$$

For (12) to hold, therefore, we must have $$m = p - (Z/G) \quad (15)$$

$$-C' + D' = -C + D - (Z/G)$$

D' is $C_N' - (F_N'/G') = C_N - (F_N/G) = D$.

Substituting this value for D' in (15) and solving for C, $$-C' + D = -C + D - (Z/G)$$

$$C' = C + (Z/G)$$

So that the screen can be used to produce the facsimile under the altered conditions if the critical density is altered by Z/G units of density.

II. Where the paper-ink density range is different

Suppose $R_B' = AR_B$ and $R_W' = BR_W$, $A \neq B$.

Then $$oq = (R_W' - R_B') \cdot -R_B' = (AR_W - BR_B) \cdot -R_B$$

$$\neq (R_W - R_B) \cdot -AR_B = rn$$

So that (13) is not satisfied and the screen suitable for reproducing the facsimile under the original conditions is not suitable under the altered conditions.

III. Where the density ratio is different

If $G' \neq G$, so that $\ln 10 \, G' \neq \ln 10 \, G$, the two terms on the left-hand side of (11) cannot be equal; thus, the preproduced screen cannot be used where the density ratio is different from that assumed in producing the screen.

I.A., I.B., I.C., I.D., II. and III. above show that: a screen of the type disclosed, with a density distribution suitable for reproducing a facsimile under one set of conditions as to the minimum and maximum densities of the copy and facsimile, the densities of the inked and uninked paper and the critical density is also suitable for reproducing a facsimile under another set of conditions providing the density ratio is the same and providing the paper-ink density range is the same.

Contrariwise, if in reproducing a piece of copy either the density ratio or the paper-ink density range is different from that assumed in the production of a screen of the type disclosed, that screen is not suitable for reproducing that particular copy.

PROCEDURE FOR USE OF THE SCREENS

In the following, the inked paper density, the uninked paper density, the paper-ink density range, the copy density minimum, the copy density maximum, the copy density range, etc., assumed in the production of a screen are called the "inked paper density of the screen," the "uninked paper density of the screen," the "paper-ink density range of the screen," etc., and the screen is called a "screen with an inked paper density of such-and-such," a "screen with an uninked paper density of such-and-such," etc.

Use of a set of screens (consisting of a number of screens with the same paper-ink density range, i.e., all produced for use with the same particular printing process, and with a range of different density ratios) involves three steps:

1. Determination of the desired density ratio
2. Choice of the most suitable screen of a set
3. Determination of the correct exposure 1. Determination of the desired density ratio (a) Measure the $D_B$ and $D_W$, the densities of the inked paper and of the uninked white paper, determined by the particular printing process in use. Calculate the paper-ink density range. Confirm that the correct set of screens, i.e., the set of screens with the appropriate paper-ink density range, is being used.

(b) Choose the desired $F_N \geq D_W$ and $F_X \leq D_B$.

(c) Measure $C_N$ and $C_X$, the minimum and maximum densities of the copy.

(d) Compute the facsimile density range $F_X - F_N$, the copy density range $C_X - C_N$ and their ratio, the density ratio.

2. Choice of the most suitable screen of a set.

(a) Assuming the set of screens consists of a large number of screens with a complete range of density ratios, the computed density ratio may be exactly equal to or very nearly exactly equal to the density ratio of one of the screens, in which case that screen is the suitable one.

Or it will lie between two screens' density ratios and differ from each by a small amount, so that, if the screen is chosen from among these two, a screen with a slightly too small density ratio is used or one with a slightly too large density ratio. To choose between these two screens, consider the effect of using a screen with a too small density ratio and one with a too large density ratio.

(b) Effect of using a screen with a too small density ratio. Let G be the computed density ratio, G' the somewhat small density ratio of the screen, and let $F_N'$ and $F_X'$ be the densities the minimum and maximum densities of the copy, $C_N$ and $C_X$, are reproduced as using the screen (i.e., for a certain critical density—the value $(F_X' - F_N')$ is determined by $(C_X - C_N)$ and G', but—see I.C. in "Use of Preproduced Screens . . ." above—a change in C changes $F_N'$ and $F_X'$ and $F_N'$ and $F_X'$ may be changed by changing C). $(F_X' - F_N') = G'(C_X - C_N) < G(C_X - C_N) = (F_X - F_N)$. I.e., if this screen is chosen, the facsimile density range will be somewhat smaller than intended.

If this screen is chosen, choose the desired $F_N'$ and $F_X'$, $F_N' \geq D_W$, $F_X' \leq D_B$, $(F_X' - F_N') = G'(C_X - C_N)$.

EFFECT OF USING A SCREEN WITH A TOO LARGE DENSITY RATIO.

(c) Let the somewhat too large density ratio of the screen be $G'$. With $F_N'$ and $F_X'$ defined as above, $(F_X' - F_N') = G'(C_X - C_N) > G(C_X - C_N) = (F_X - F_N)$, i.e., the facsimile density range is somewhat larger than intended; it being possible to write these relations only for those $F_N'$ and $F_X$ where $F_N' \geq D_W$ and $F_X' \leq D_B$, i.e., the condition $(D_B - D_W)/(C_X - C_N) \geq G'$ is required.

With $(D_B - D_W)/(C_X - C_N) \geq G'$, if this screen is chosen, choose the desired $F_N'$ and $F_X'$, $F_N' \geq D_W$, $F_X' \leq D_B$, $(F_X' - F_N') = G'(C_X - C_N)$.

(d) Suppose, for the screen with density ratio $G'$ slightly too large, $(D_B - D_W)/(C_X - C_N) < G'$. At least one tone of the copy is reproduced as density $D_B$ or one as density $D_W$, since otherwise we can write $F_N' > D_W$ and $F_X' < D_B$, so that $(F_X' - F_N') = G'(C_X - C_N) < (D_B - D_W)$, contrary to hypothesis. Because the reproduction curve is a line with slope $G'$, there are densities of the copy with range not greater than $(D_B - D_W)/G'$ which are reproduced as densities between, but not including, $D_B$ and $D_W$. Denote by $C_N'$ the minimum of these densities and the maximum by $C_X'$. Since $(C_X' - C_N') = (D_B - D_W)/G' < (C_X - C_N)$, there are densities of the copy outside the range between $C_N'$ and $C_X'$ which are reproduced as either $D_B$ or $D_W$—as $D_W$, i.e., as uninked paper, if they are less than $C_N'$ and as $D_B$, i.e., as solidly inked paper, if they are greater than $C_X'$. Thus, under the stated condition, the lighter and/or darker tones of the copy are truncated to a small degree in the facsimile.

So that if $(D_B - D_W)/(C_X - C_N) > G'$ and if it is desired to reproduce the copy with the lighter and/or darker tones truncated to a slight degree, choose this screen and choose the desired values for the $C_N'$ and $C_X'$ above, $C_N' \geq C_N$, $C_X' \leq C_X$, $(D_B - D_W)/(C_X' - C_N') \leq G'$.

(e) If a greater degree of truncation is desired, use a screen with a larger density ratio $G'$ and choose the $C_N'$ and $C_X'$ with $(D_B - D_W)/(C_X' - C_N') \leq G'$, $C_N' \geq C_N$, $C_X' \leq C_X$.

3. Determination of the correct exposure (a) With the copy replaced by a perfectly white diffusely reflecting object, determine the exposure time of the lithographic film just necessary to prevent ink from being deposited by the printing plate made from the film.

For the exposure with this exposure time, the image illumination is the exposure illumination, as this term is defined in "Definitions" above; the critical illumination ((exposure illumination)/(maximum image illumination)) is 1; and the critical density (-log(critical illumination)) is 0. Call the exposure time the "critical exposure time" and the exposure of the film the "critical exposure." As described above in "Definitions," the critical density, assuming reciprocity, is changed by log A units of density by changing the exposure by the factor A (or changing the log exposure by log A units); equivalently, taking A = antilog B, the critical density is changed by B units of density by changing the exposure by the factor antilog B (or changing the log exposure by B units). So that, if use of a screen requires a critical density of B, the correct exposure is obtained by multiplying the critical exposure by antilog B (or the correct log exposure by changing the log exposure equal to the log critical exposure by B units).

In producing a screen, a certain critical density is assumed: there is a "critical density of the screen" and the screen is a "screen with a critical density of such-and-such."

(a) If in using a screen, the minimum and maximum facsimile densities, the minimum and maximum copy densities, and the densities of the inked and uninked paper are identical to those assumed in the production of the screen, the critical density is taken as equal to the critical density of the screen. If C is the critical density of the screen, then the correct exposure is obtained by changing the exposure equal to the critical exposure by the factor antilog C, most conveniently by changing the exposure time equal to the critical exposure time by the factor antilog C.

(b) If, on the other hand, the stated densities are not identical, respectively, to those assumed in the production of the screen, the critical density is obtained by altering the density equal to the critical density of the screen in each of the following ways:

(1) Divide $(F_X - F_N)$ (case 2(a)) or $(F_X' - F_N')$ (cases 2(b) and 2(c)) by the facsimile density range of the screen, or $(C_X - C_N)$ (cases 2(a), 2(b) and 2(c)) or $(C_X' - C_N')$ (cases 2(d) and 2(e)) by the copy density range of the screen, to determine the factor N by which the minimum and maximum facsimile densities, and the minimum and maximum copy densities, are changed from the values assumed in the production of the screen. Change, in accordance with I.A. of "Use of Preproduced Screens . . . ," above, the density equal to the critical density of the screen by D(N−1) units of density, where D is defined by (6) in terms of the minimum and maximum facsimile and copy densities of the screen.

(2) Subtract N times the minimum facsimile density of the screen from $F_N$ (case 2(a)) or $F_N'$ (cases 2(b) and 2(c)) or $D_W$ (in cases 2(d) and 2(e) if the lighter tones are truncated, i.e., if $C_N' > C_N$), or N times the maximum facsimile density of the screen from $F_X$ (case 2(a)) or $F_X'$ (cases 2(b) and 2(c)) or $D_B$ (in cases 2(d) and 2(e) if the darker tones are truncated, i.e., if $C_X' < C_X$), to determine the units of density Y by which the minimum and maximum facsimile densities are changed. Change, in accordance with I.B. above, the density obtained in step (1) by -Y/G units, where G is given by (6) in terms of the minimum and maximum facsimile and copy densities of the screen.

(3) Subtract N times the minimum copy density of the screen from $C_N$ (cases 2(a), 2(b) and 2(c)) or $C_N'$ (cases 2(d) and 2(e)), or N times the maximum copy density of the screen from $C_X$ (cases 2(a), 2(b) and 2(c)) or $C_X'$ (cases 2(d) and 2(e)), to determine the units of density Q by which the minimum and maximum copy densities are changed. Change, in accordance with I.C. above, the density obtained in (2) by Q units.

(4) Subtract the inked paper density of the screen from the computed inked paper density, or the uninked paper density of the screen from the computed uninked paper density, to determine the units of density Z by which the inked and uninked paper densities are changed. Change, in accordance with I.D. above, the density obtained in (3) by Z/G units of density, where G is as in (2).

If the critical density resulting from applying each of the alterations in (1)−(4) is A, the correct exposure is that obtained by multiplying the critical exposure by the factor antilog A.

FABRICATION OF THE SCREENS

A screen is fabricated by a computer-controlled rotating-drum plotter or flatbed plotter. Data is input to the plotter by a magnetic tape written by another computer.

GENERATION OF VARIATES WITH A GIVEN DISTRIBUTION

The tape-writing computer generates an ensemble of variates with the required distribution and outputs it onto a tape to be read by the film-writing device. The computer generation of variates with a desired distribution is a well-studied computer task, and can be accomplished in several ways.

In one method, an ensemble of variates having the uniform distribution is first generated, i.e., variates such that the probability that a variate is less than or equal to x is equal to x. The function equal to the inverse of the desired distribution is then applied to each of these variates; the resulting numbers then have the desired distribution. See, e.g., von Neumann, p. 37; Juncosa, p. 17; IBM, p. 2; Knuth, p. 102. This method is suitable where, as in fabricating the screens, the inverse function is a library function or algebraic function and hence is easily computed.

OTHER METHODS

Although fabrication of the screen is illustrated below by use of the "inverse method" described above for generating variates with a desired distribution, other methods have been suggested. See, e.g., von Neumann, pp. 37-38 (two methods, one adaptable to obtaining variates with the exponential distribution and involving only determination of inequalities); Marsaglia; and Kinderman et al. Thus, fabrication of the invention is not dependent on or restricted by any one computer algorithm for obtaining variates with a desired distribution.

MULTIPLICATIVE CONGRUENTIAL METHOD FOR GENERATING UNIFORM VARIATES

This method, also called the "linear congruential" or "power residue" method, suggested by Lehmer in the reference cited, p. 144 (see IBM, p. 5, example 6), is the one currently most often employed.

In this method, the $(n+1)$th variate between 0 and $2^b$ is obtained from the nth by the recursive formula $u_{n+1} \equiv xu_n \pmod{2^b}$. I.e., the $(n+1)$th variate is obtained by multiplying the nth variate by x and taking the remainder on dividing the resulting product by $2^b$.

A string of $2^{b-2}$ variates is produced before the string begins to repeat itself. The number x may be any number of the form $8t\pm3$, t an integer; preferably a number approximately equal to $2^{b/2}$. The first variate, $u_0$, may be any odd number.

On this method, see, e.g., Dorn et al., pp. 47-53, 63-66; IBM, pp. 3-6, 10; Juncosa, pp. 5-9, 19-20; Knuth, pp. 9-24; Lehmer, p. 144; Naylor et al., pp. 47-57.

In Fortran IV, the library function MOD([variable 1], [variable 2]) computes the remainder when variable 1 is divided by variable 2, so that an array JRAND of n variates is obtained by writing, after initializing JRAN and MULT,

```
    DO 1 I=1, [n]
    JRAN=MOD(JRAN,MULT)
  1 JRAND(I)=JRAN
```

SPECIMEN SCREEN

Suppose $D_B=1.3$, $D_W=0.1$, $C_N=0.05$, and $C_X=1.8$. Suppose $F_N=D_W$ and $F_X=D_B$. Suppose the width of the square areas is 120 microns and the screen is 1440 squares wide and 1060 squares high (17.28 cm×12.72 cm). The screen with a linear reproduction curve is to be fabricated.

TAPE FORMAT FOR PERKIN-ELMER PDS MICRODENSITOMETER

The screen may be plotted, e.g., by a Perkin-Elmer PDS Microdensitometer (flatbed plotter), whose magnetic tape recording and data formats are as follows (see Perkin-Elmer, pp. 6-7).

The tape (standard half-inch tape) is written at 800 CPI, odd parity, binary mode. The computer controlling the PDS Microdensitometer is a Digital Equipment Corporation PDP-8, which reads only 7-track tapes, or 9-track tapes written in the mode (DEC "SIXBIT mode") in which two of the nine tracks are unutilized.

Each record consists of seven groups of data:
1. 24 bits: octal 7777, a beginning-of-record mark.
2. 480 bits: the "sample identification information" identifying the record; it consists of 40 12-bit words, each word consisting of an 8-bit ASCII character (right justified). The 40 characters need not conform to any particular format.
3. 12 bits: minus the number of data values in the record.
4. 24 bits: the X coordinate (positive or negative) of the first pixel of the record, in microns.
5. 24 bits: the Y coordinate (positive or negative) of the first pixel, in microns.
6. 24 bits: the X increment (positive or negative) between pixels, in microns.
7. 4000 or fewer 12-bit words: the values of density, or transmittance, X 400.

Each record contains the data for one line of the plotted output, unless there are more than 4000 pixels per line, in which case the data for the line is divided between two or more records. The records are unblocked and followed by an EOF mark.

REQUIRED DENSITY DISTRIBUTION OF THE SPECIMEN SCREEN

The required distribution is given by (2):

$$\frac{\exp[\ln 10 \, G(d - C + D)] - R_B}{R_W - R_B}$$

or $$\frac{\exp(Td - U) - V}{W}$$

where
$T = \ln 10 \, G$
$U = \ln 10 \, G(C-D)$
$V = R_B$
$W = R_W - R_B$

These quantities are determined in terms of $D_B$, $D_W$, $C_N$, and $C_X$.

G is, according to (5), with $F_N=D_W$ and $F_X=D_B$, $(D_B-D_W)/(C_X-C_N)$. G, according to (9) and (10) is $C_N+S_X$ or $C_X+S_N$; choose C, say equal to $C_N+C_X$, so that $S_N=C_N$ and $S_X=C_X$, that is, such that the minimum and maximum densities of the screen are equal to those of the copy. D is, according to (3) and (4), with $F_N=D_W$ and $F_X=D_B$, $C_N-(D_W/G)$ or $C_X-(D_B/G)$; and $C-D$ can be taken $(C_N+C_X)-[C_N-(D_W/G)]=C_X+(D_W/G)$. $G(C-D)$ is $G[C_X+(D_W/G)]=GC_X+D_W$, which is $$\frac{D_B - D_W}{C_X - C_N} C_X + D_W =$$

$$\frac{D_B C_X - D_W C_X + D_W C_X - D_W C_N}{C_X - C_N} = \frac{D_B C_X - D_W C_N}{C_X - C_N}$$

$R_B$ is antilog $(-D_B)$ and $R_W-R_B$ is antilog $(-D_W)$ − antilog $(-D_B)$. So that
 T = ln 10 $(D_B-D_W)/(C_X-C_N)$
 U = ln 10 $(D_B C_X - D_W C_N)/(C_X - C_N)$
 V = antilog $(-D_B)$
 W = antilog $(-D_W)$ − antilog $(-D_B)$
With $D_B=1.3$, $D_W=0.1$, $C_N=0.05$ and $C_X=1.8$; T is $(2.3026)(1.2)/(1.75)=1.5789$, U is $(2.3026)(2.34-0.005)/(1.75)=3.0723$, V is 0.05012 and W is $0.79433-0.05012=0.74421$. So that the required density distribution is $$[\exp(1.5789d - 3.0723) - 0.05012]/0.74421 \quad (16)$$

Figure 1:
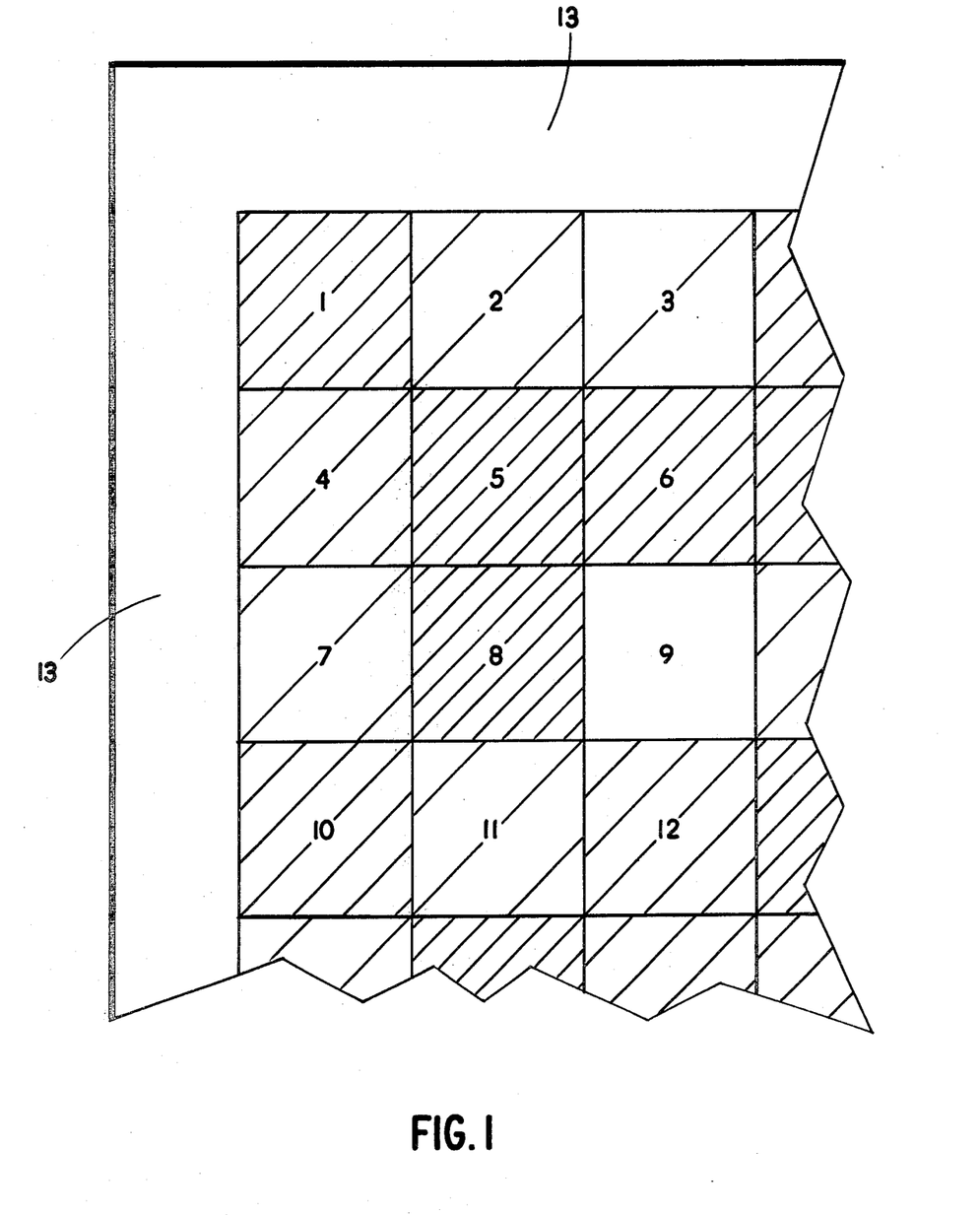
Figure 2:
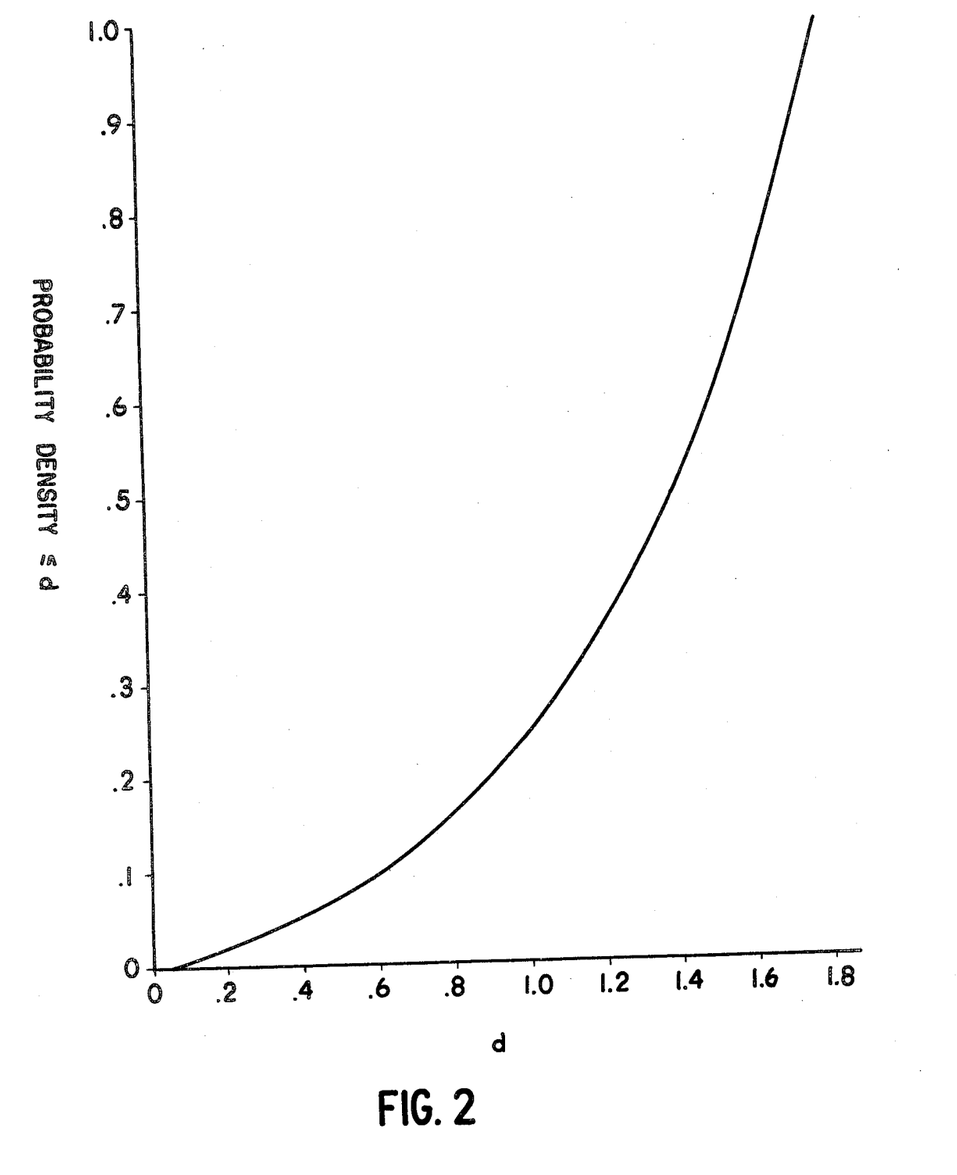
FIG. 2 is the distribution of a specimen screen. See below under "Required Density Distribution of the Specimen Screen."

The graph of this distribution is shown in FIG. 2.

MODIFIED DISTRIBUTION PRODUCING 256 OUTPUT LEVELS AND ITS INVERSE

The PDS Microdensitometer outputs data to eight significant bits, i.e., it plots $2^8=256$ different levels of density. Each datum output is one of the 256 numbers 0000, 0010, 0020, ..., 3770 (decimal 0, 8, 16, ..., 2040), representing density values equal to the decimal number divided by 400, viz., the densities 0, 0.02, 0.04, ..., 5.10. Call these densities the "data densities." The actual film written may be given densities—call them "final densities" a linear function of these densities: if d′ is a data density, the corresponding final density made be made $d=Ad'+B$, with A and B chosen as desired. A is determined by the gamma of the film medium and B by its speed and the modulation amplitude of the film-writing light source.

Suppose the data densities were given the distribution (16), the final densities being the same as these: $A=1$ and $B=0$. Then the data densities would represent densities between 0.05 and 1.8, and each density plotted by the microdensitometer would be one of the densities 0.06, 0.08, ..., 1.8—the number of these levels of density being far fewer than 256.

The fewer the number of output levels, the less the discrete density distribution given the screen approximates the desired continuous distribution. The number of levels is made the maximum 256 by the following means.

Supposve variates d have distibution P(x), and $d=F(d')$ for each variate. Then if F is an increasing function, the distribution of the d′ is P[F(x)], since if $d' \leq X$, $F(d') \leq F(x)$, $d \leq F(x)$, which, with P the distribution of the d, occurs with probability P[F(x)]. Also, writing $d'=F^{-1}(d)$ and invoking the same relation, if P[F(x)] is the distribution of the d′, the distribution of the d is $P(F[F^{-1}(x)])=P(x)$.

Write $d'=5.1(d-S_N)/(S_X-S_N)$, with the d′ and d data and final densities. Then, the d being numbers between $S_N$ and $S_X$, the data densities have values between 0 and 5.1 and can be output in 256 levels. Let $5.1(d-S_N)/(S_X-S_N)$ be the $F^{-1}(d)$ above. Solving $$d' = \frac{5.1(d - S_N)}{(S_X - S_N)}$$

for d to determine F(d′), $$(d - S_N) = \frac{d'(S_X - S_N)}{5.1}$$

$$d = \frac{d'(S_X - S_N)}{5.1} + S_N$$

So that by the above if the d′ are given distribution $P[F(x)]=P([d'(S_X-S_N)/5.1]+S_N)$, the distribution of the $d=[d'(S_X-S_N)/5.1]+S_N$ is P. I.e., take the A above to be $(S_X-S_N)/5.1$ and the B to be $S_N$ and the final densities with distribution P are obtained. Each of the d′ being one of the 256 values between 0 and 5.1 0, $(5.1)/255$, $2(5.1)/255$, ..., $254(5.1)/255$, 5.1, each of these is one of the 256 values between $S_N$ and $S_X$ $S_N$, $S_N+[(S_X-S_N)/255]$, $S_N+[2(S_X-S_N)/255]$, ..., $S_N+[254(S_X-S_N)/255]$, $S_X$; in the case of the specimen screen one of the 256 values between 0.05 and 1.8 .05, $0.05+[(1.8-0.05)/255]$, $0.05+[2(1.8-0.05)/255]$, ..., $.05+[254(1.8-0.05)/255]$, 1.8.

The modified distribution is, with $S_N=C_N$ and $S_X=C_X$, $$\frac{\exp[T([d'(C_X-C_N)/5.1]+C_N)-U]-V}{W}$$

or $$\frac{\exp(T'd' - U') - V'}{W'}$$

where
 $T'=T(C_X-C_N)/5.1$
 $U'=U-TC_N$
 $V'=V$
 $W'=W$
T′ is ln $10(D_B-D_W)/(C_X-C_N)\cdot(C_X-C_N)/5.1=$ ln 10 $(D_B-D_W)/5.1$, and U′ is $$= \ln 10 \frac{(D_B C_X - D_W C_N)}{C_X - C_N} - \ln 10 \frac{(D_B - D_W)C_N}{C_X - C_N}$$

$$= \ln 10 \frac{(D_B C_X - D_W C_N - D_B C_N + D_W C_N)}{C_X - C_N} =$$

$$\ln 10 \frac{[D_B(C_X - C_N)]}{C_X - C_N}$$

$$= \ln 10 \, D_B$$

V′ is V = antilog $(-D_B)$ and W′ is W = antilog $(-D_W)$ − antilog $(-D_B)$.

The data are obtained by applying the inverse of this function to the uniform variates between 0 and 1 and multiplying the resulting numbers by 400.

Letting $$y = \frac{\exp(Td' - U') - V'}{W'}$$

and solving for d' to obtain the inverse function, $$W'y = \exp(Td' - U') - V'$$

$$W'y + V' = \exp(Td' - U')$$

$$\ln(W'y + V') = Td' - U'$$

$$\ln(W'y + V') + U' = T'd'$$

$$\frac{\ln(W'y + V') + U'}{T} = d'$$

In the case of the specimen screen, T' is $(2.3026)(1.3-0.1)/5.1=0.54178$, U' is $(2.3026)(1.3)=2.9934$, V' is V=0.05012 and W' is W=0.74421, so that the inverse function is $[\ln(0.74421y+0.05012)+2.9934]/0.54178$.

DECSYSTEM-10 PROGRAM

Following is a program for the Digital Equipment Corporation DECsystem-10 which produces a tape conforming to the PDS Microdensitometer format. The integer word-length of the DECsystem-10 being 36 bits, the sequence of the 12- and 24-bit numbers required can be conveniently produced by outputting 36-bit words consisting of the numbers written once beside the other. In one case (JYC, the Y coordinate), it is necessary to split the number between adjacent words.

This program writes two test strips at the bottom of the screen for determining if its densities are as desired; they each consist of a row of 16 squares, 1.08 cm wide, each square of uniform density; the density of the squares increases from the top left one to the top right one to the bottom left one to the bottom right one.

```
C  /TO GET FILE OF 1240 RECORDS, EACH 1440 12-BIT NUMBERS; FIRST
C  /1060 RECORDS, RANDOM VARIATES 0, OR 8, OR 16, . . . , OR 2040
C  //(OCTAL 0, OR 10, OR 20, . . . , OR 3770) WITH DISTRIBUTION
C  /(EXP(.54178(X/400) - 2.9934) - .05012)/.74421; NEXT 90
C  /RECORDS EACH RECORD THE INCREASING STAIRCASE FUNCTION
C  / [(L - 1)/90]64, 0 < L < 1441; LAST 90 RECORDS, THE FUNCTION
C  /[(L - 1)/90]64 + 1024
   DOUBLE PRECISION DYCIN
   DIMENSION JOUT12(3),JOUT36(480)
   OPEN (UNIT=6,DEVICE='MTAPE',ACESS='SEQOUT',MODE='IMAGE',PARITY='0
   1DD',DENSITY='800')
   DATA JRAN1,MULT,MDLS/6877311,2051,8388608/
C  /RECORD MARK OCTAL 7777, "SAMPLE ID. INFORMATION: LINE NUMBER"
C  /IN 8-BIT ASCII, EACH ASCII CHARACTER RIGHT JUSTIFIED IN
C  /12-BIT WORD, 3 12-BIT WORDS WRITTEN ONE BESIDE THE OTHER:
   DATA MRKSA,JMPL,JEXI,JDZX,JINF,JORM,JATI,JONQ,JKLI,JNEX,JNUM,JBER/
   1"777703230301,"031503200314,"030502400311,"030402560240,"031103160
   2306,"031703220315,"030103240311,"03103160272,"024003140311,"03160
   33050240,"031603250315,"030203050322/
C  /GET THE 120 RECORDS:
   DO 1 I=1,1240
C  /GET THE 4 DECIMAL DIGITS OF I TO WRITE I IN ASCII:
   JDIG1=INT(FLOAT(I)/1000.)
   JDIG2=INT((FLOAT(I)-FLOAT(JDIG1*1000))/100.)
   JDIG3=INT((FlOAT(I)-FlOAT(JDIG1*1000)-FLOAT(JDIG2*100))/10.)
   FDIG4=I-(FDIG1*1000)-(JDIG*100)-(FDIG3*10)
C  /SPACE, FIRST 2 DIGITS OF I:
   JSD1D2=(160*(2**24))+((JDIG1+176)*(2**12))+(JDIG2+176)
C  /THIRD AND FOURTH DIGITS OF I, PARAMETER —NR = —1440:
   JD3D4N=((JDIG3+176)*(2**24))+((JDIG4+176)*(2**12))+((2**12)-1440)
C  /XC AND THE 12 MOST SIGNIFICANT BITS OF YC:
C  /XC (= —86400, ENTERED TO OCCUPY LEFT 24 BITS):
   JXC= -(86400*(2**12))
C  /YC (24-BIT TWO'S COMPLEMENT IF NEGATIVE):
   IF (74400 2,3,3
   2 JYC=(2**24)+(74400-((I-1)*120))
   GO TO 4
   3 JYC=74400-((I-1)*120)
C  /12 MOST SIGNIFICANT BITS OF YC:
   4 JYCMS=INT(FLOAT(JYC)/FLOAT(2**12))
   JXCYC=JXC+JYCMS
C  /12 LEAST SIGNIFICANT BITS OF YC AND IN (= 120) (ENTERED AS
C  /MINUS THE 36-BIT TWO'S COMPLEMENT IF THE FIRST (FROM THE
C  /LEFT) OF THE 12 LEAST SIGNIFICANT BITS IS 1:
C  /THE 12 LEAST SIGNIFICANT BITS:
   JYCLS=JYC-(JYCMS*(2**12))
C  /FIRST BIT:
   JBIT1=INT(FLOAT(JYCLS)/FlOAT(2**11))
   IF (JBIT1) 5,5,6
   5 JYCIN=(JYCLS*(2**24))+120
   GO TO 7
   6 DYCIN=-((DFLOAT(2**18)*DFLOAT(2**18))-(DFLOAT(JYCLS)*DFLOAT(2**24)
   1+120D0))
   JYCIN=IDINT(DYCIN)
   7 CONTINUE
C  /TO GET 480, EACH 3 12-BIT VARIATES:
   DO 8 J=1,480
   IF (I-1060) 9,9,10
C  /BEGINNING OF FIRST BRANCH, FOR I < 1061
```

```
                                   -continued
  9 DO 11 K=1,3
C /GET UNIFORM VARIATE BETWEEN 0 AND MDLS:
  JRAN1=MOD((MULT*JRAN1),MDLS)
C /GET UNIFORM VARIATE BETWEEN 0 AND 1:
  RAN2=FLOAT(JRAN1)/FLOAT(MDLS)
C /GET VARIATE BETWEEN 0 AND 5.1 WITH DISTRIBUTION
C /(EXP(.54178X − 2.9934) − .05012)/.74421 (BY APPLYING INVERSE
C / OF THIS FUNCTION TO RAN 2:
  RAN3=(ALOG((.74421*RAN2)+.05012)+2.9934)/.54178
C /ROUND RAN3 × 400 TO NEAREST OF 256 VALUES 0, 8, 16, ... ,
C /2040:
  11 JOUT12(K)=(INT(((RAN3*400.)/8.)+.5))*8
  JOUT36(J)=(JOUT12(1)*(2**24))+(JOUT12(2)*(2**12))+JOUT12(3)
C /SKIP SECOND BRANCH:
  GO TO 8
C /END OF FIRST BRANCH
C /BEGINNING OF SECOND BRANCH, FOR I > 1060:
  10 J0OR1=INT(FlOAT(I+1061)90.)
  JOUT36(J)=(((INT(FlOAT(J−1)/30.)):64)+(1024*J0OR1))*((2**24)+2**1
  12)+1)
C /END OF SECOND BRANCH
  8 CONTINUE
  WRITE(6) MRKSA,JMPL,JEXI,JDZX,JINF,JORM,JATI,JONQ,JXLI,JNEX,JNUM,
  1JBER,JSD1D2,JD3D4N,JXCYC,JYCIN,JOUT36
  1 CONTINUE
  END FILE 6
  CLOSE (UNIT=6,DEVICE='MTAPE')
  STOP 'TAPE WRITE EXECUTED'
  END
```

Here MDLS is $2^{23}=8,388,608$, so that the number of variates which would be generated without repetition of the sequence is $2^{23-2}=2^{21}=2,097,152$ (the number generated is $1440\times1060=1,526,400$). MULT is $2^{11}+3=2048+3=2051$, a number of the form $8t+3$ close to $2^{23/2}$.

Execution of this program—which was not written with any consideration for execution time—requires a CPU time of 2 min. 45.16 sec., and thus constitutes a simple computer task. The first five data output are octal 3030, 0760, 3000, 3470 and 3520, and the last five—the last five of the 1060th line, the 1,526,396th to the 1,526,400th data—are 3600, 2550, 2000, 2550 and 3670.

A somewhat similar program may be written for the DEC OS/8 System, whose computer is the same model, the DEC PDP-8, as the PDS Microdensitometer's; as the OS/8 Fortran IV integer word-length is 24 bits.

The rotating-drum or flatbed film plotters currently marketed by a number of manufacturers, besides Perkin-Elmer Corp.,—e.g., Joyce-Loebl, Optronics International, Inc., the Gerber Scientific Instrument Co-—are similarly adaptable to fabrication of the invention.

ADVANTAGES OF THE DISCLOSED SCREENS

The halftone contact screens disclosed herein have the following advantages over the halftone contact screens heretofore employed:

1. With use of the same printing means, higher resolution of the facsimile.

The resolution of a halftone facsimile is determined by the interval at which the projected image of the copy is "sampled," i.e., the distance between the centers of the small areas of the image whose different luminances are "measured"—i.e., made to produce different effects in the facsimile (different-sized dots when the commonly-employed screen is employed or different probabilities of the occurrence of a black spot when the disclosed screen is employed).

When the screen disclosed is used, the sampling interval is equal to the interval between the centers of the adjacent square areas of the screen and so the resolution of the facsimile is determined by this interval. This interval is optimally approximately equal to the diameter of the smallest printable area. When the commonly-used screen is employed, on the other hand, the sampling interval is equal to the period of the screen and so the resolution of the facsimile is determined by this period. This period is optimally three to four times the diameter of the smallest printable area—the diameter of the smallest of the various-sized black dots (so that the diameter of the largest dot, equal to the period, can be three to four times the diameter of the smallest). Hence, with the same printing means, the resolution of the facsimile produced by the disclosed screen is three to four times that of the facsimile produced by the commonly-employed screen.

2. Exact control of tone reproduction.

It is difficult to produce halftone contact screens of the type heretofore employed which result in the exact reproduction curve desired. Compensating for different density ratios is often difficult. The disclosed screens offer the means of exactly controlling the reproduction curve by choice of the screen with the appropriate density distribution. Different screens can be chosen exactly suited to different density ratios.

3. A further advantage of the screens disclosed by the present specification is that, because they are not periodic, as are almost all screens presently used, they do not produce unwanted moire patterns in color work and rescreening. The need for the careful adjustment of the angles among the screens in producing color separations and between the screen and the dot pattern of the copy in rescreening is thus eliminated.

4. A further advantage of the screens of the type disclosed is that, with the appropriate screens of this type, a sharp edge between the lightest and darkest tones of the copy is reproduced without change in the printed positive facsimile, while using the commonly-employed screens under normal conditions such an edge, when straight, is reproduced as a wavy line. If $F_N=D_W$ and $F_X=D_B$, i.e., if $P_2$, the probability that the output density is less than or equal to the critical density where the copy density is the minimum, is 1, and $p_1$, the probability that the output density is less than or equal to the critical density where the copy density is the maximum, is 0, the lightest tone is reproduced as solid white, and the darkest tone as solid black, at every point of the facsimile, including points within an area corresponding to a single square area of the screen. (In the special case of copy with very sharp edges, the assumption that the image density is constant over each square area of the screen is not made.) Thus printed matter, for instance, is reproduced without change; and the printer can include such matter in the screened copy instead of having to go to the inconvenience of stripping it in separately.

MASTER SCREENS

An economy in the production of the halftone contact screens disclosed is achieved by first producing a computer-generated photographic transparency on a continuous-tone film. In this way, an indefinitely large number of screens can be obtained from a single transparency, as an indefinitely large number of positive photographic prints can be obtained from a single photographic negative. In this disclosure, such a computer-generated transparency is called a "master screen."

For a computer-generated transparency consisting of a rectangular array of small abutting square areas each of uniform density, where the density of a typical square area $d'$ is described by a random variable, denote the density distribution by $P_M(x)$.

Contact print the transparency on continuous-tone film.

The equation of the line a part of which coincides with the linear portion of the H-D curve of the film (graph of density d against log exposure l [in this typescript lower case letter L is typed l to distinguish it from the number one]) is $d = \gamma(l-L)$, where $\gamma$ is the gamma of the film and L is the l-intercept of the line. Let the contact exposure be in the linear portion of the "Hurter-Driffield (or "characteristic") curve (graph of density as a function of log exposure)". Where the density of the transparency is $d' = -\log t'$, where $t'$ is the transmittance of the transparency, the exposure of the film is $Kt'$, where K is the constant equal to the exposure which would be given the film at a point if $t'$ were equal to 1 there, i.e., the exposure given the film, under the same conditions of illumination by the contact-printing light source and the same exposure time, if the transparency is removed. The log exposure l is thus $\log Kt' = \log K + \log t' = \log K - d'$.

The density of the developed film where the density of the transparency is x is thus $\gamma(\log K - x - L)$. If $\gamma < 0$, and $\gamma(\log K - d' - L)$ is an increasing function of $d'$, i.e., if the film is positive film, the probability that $d' \geq x$, $P_M(x)$, is equal to the probability that $d \geq \gamma(\log K - x - L)$. If $P(y)$ denotes the density distribution of the developed film, with $y = \gamma(\log K - x - L)$, $$P[\gamma(\log K - x - L)] = P_M(x) \quad (17)$$

If $\gamma > 0$, i.e., if the film is negative film, $\gamma(\log K - d' - L)$ is a decreasing function of $d'$; the probability that $d' \leq x$, $P_M(x)$, is equal to the probability that $d \geq \gamma(\log K - x - L)$; and the probability that $d < \gamma(\log K - x - L)$, equal to the probability that $d \leq \gamma(\log K - x - L)$, is $1 - P_M(x)$. If $P(y)$ denotes the density distribution of the developed negative film, $$P[\gamma(\log K - x - L)] = 1 - P_{M(x)} \quad (18)$$

If, now $P(y)$ is a given desired density distribution of the film, this distribution is produced, if the film is positive film, by taking, in accordance with (17), $P_M(x)$ to be $P[\gamma(\log K - x - L)]$; and if the film is negative, by taking, in accordance with (18), $P_M(x)$ to be $1 - P[\gamma(\log K - x - L)]$.

Halftone contact screens may be produced from the master screens described not only by contact printing but by optical reduction or enlargement.

I claim:

1. The halftone contact screen consisting of a substantially plane medium whose optical density varies in a pattern: in which said pattern consists of a rectangular array of a large number of small abutting square areas (a "rectangular array of areas" being understood as defined in this disclosure) each of uniform density; in which the density of said square areas is described by a random variable whose cumulative distribution function is equal to a real-valued and positive (with values between 0 and 1 inclusive), increasing function P(d) of density d; that is to say, the probability that the density of an arbitrary one of said square areas is less than or equal to density d is equal to P(d); in which the knowledge of the density of one square area constitutes a minimum of information as to the density of any other square area, that is to say, if a. N is the number of the square areas of said array, b. the square areas are numbered 1 to N in an arbitrary order, c. X is said random variable, defined on the positive integers between 1 and N inclusive, whose value at k, k a positive integer between 1 and N inclusive, is the density of the square area numbered k, d. Y is the random variable defined by $Y(k) = X[\text{Rem}(k+n, N)]$, where n is an arbitrary fixed positive integer between 1 and $N-1$ inclusive and Rem$(k+n, N)$ is the remainder when $k+n$ is divided by N—i.e., $k+n$ if $k+n \leq N$ and $k+n-N$ if $k+n > N$—except when $k+n = N$, when it is N, then X and Y are independent random variables; and in which said function P(d) of density is $(\exp[-\ln 10 \, R(C-d)] - R_B)/(R_W - R_B)$, where C is a positive constant real number $R_B$ is equal to the reflectance of printing paper when said paper is inked $R_W$ is equal to the reflectance of said paper when uninked $R(d')$ is an arbitrarily-chosen positive, real-valued, increasing function defined on the positive real numbers $d'$ (so that, in accordance with the argument set out above in this disclosure, C being made the "critical density" as this is defined above in this disclosure, $R(d')$ is the "reproduction curve," that is to say, the graph of the integrated density of the positive facsimile printed on said paper as a function of the copy density $d'$).

2. The halftone contact screen of claim 1 in which said function $R(d')$ is equal to the linear function $G(d'-D)$, where G and D are positive real constants (so that said function P(d) of density d is equal to $(\exp[\ln 10 \, G(d-C+D)] - R_B)/(R_W - R_B))$, and except that $R_B$ is equal to the reflectance of said paper when inked times F, where F is a positive real constant, and $R_W$ is equal to the reflectance of said paper when uninked times F (so that, as described above in this specification in section D. of section I. of "Use of Preproduced Screens under Altered Conditions," said critical density being made $C+(\log F)/G$, G is the slope of said reproduction curve and D is the d'-intercept of said curve).

3. The process of producing the halftone contact screen of claim 1 which comprises exposing a photographic medium through a transparency (said medium being exposed to the not out-of-focus image of said transparency) under the conditions of illumination of said transparency by a light source, and with the exposure time, which give said medium the exposure equal to the value K specified below in this claim when said transparency is removed from the path of light from said light source to said medium; in which the density of said transparency varies in a pattern consisting of a rectangular array of a large number of small abutting square areas each of uniform density, the density of said square areas being described by a random variable whose cumulative distribution function is equal to $J+(-1)^J P[\gamma(\log K - x - L)]$, where P is the function specified in claim 1 x is density $\gamma$ is the gamma of said photographic medium

J is equal to 0 when said photographic medium is a positive medium and equal to 1 when said medium is a negative medium L is the abscissa of the point where the linear portion, extended, of the Hurter-Driffield curve (graph of density of the processed medium as a function of log exposure) of said medium intercepts the coordinate of log exposure, and K is a positive real constant; and in which the knowledge of the density of one square area constitutes a minimum of information as to the density of any other square area.

* * * * *